United States Patent [19]

Solheim et al.

[11] Patent Number: 5,139,961
[45] Date of Patent: Aug. 18, 1992

[54] REDUCING BASE RESISTANCE OF A BJT BY FORMING A SELF ALIGNED SILICIDE IN THE SINGLE CRYSTAL REGION OF THE EXTRINSIC BASE

[75] Inventors: Alan G. Solheim, Puyallup, Wash.; Bamdad Bastani, Danville, Calif.; James L. Bouknight, Puyallup, Wash.; George E. Ganschow, Trabuco Canyon, Calif.; Bancherd Delong, Puyallup, Wash.; Rajeeva Lahri, Puyallup, Wash.; Steve M. Leibiger, Graham, Wash.; Christopher S. Blair, Puyallup, Wash.; Rick C. Jerome, Puyallup, Wash.; Madan Biswal, Puyallup, Wash.; Tad Davies, Puyallup, Wash.; Vida Ilderem, Puyallup, Wash.; Ali A. Iranmanesh, Federal Way, Wash.

[73] Assignee: National Semiconductor Corporation, Santa Clara, Calif.

[21] Appl. No.: 503,498

[22] Filed: Apr. 2, 1990

[51] Int. Cl.$^5$ .................................. H01L 21/33
[52] U.S. Cl. ........................... 437/33; 437/67; 437/162; 437/200; 148/DIG. 10
[58] Field of Search ............ 437/31, 33, 59, 199, 437/200, 67, 69, 46, 162; 148/DIG. 10, DIG. 11, DIG. 147

[56] References Cited

U.S. PATENT DOCUMENTS

| | | | |
|---|---|---|---|
| 3,955,269 | 5/1976 | Magdo et al. | 437/59 |
| 4,484,388 | 11/1984 | Iwasaki | 437/59 |
| 4,498,227 | 2/1985 | Howell et al. | 437/33 |
| 4,507,847 | 4/1985 | Sullivan | 437/31 |
| 4,536,945 | 8/1985 | Gray et al. | 437/59 |
| 4,538,343 | 9/1985 | Pollock et al. | 437/67 |
| 4,609,568 | 9/1986 | Koh et al. | 437/200 |
| 4,735,912 | 4/1988 | Kawakatsu | 437/162 |
| 4,764,480 | 8/1988 | Vora | 437/54 |
| 4,824,794 | 4/1989 | Tabata et al. | 437/33 |
| 4,824,796 | 4/1989 | Chiu et al. | 437/33 |
| 4,857,476 | 8/1989 | Colinge | 437/33 |
| 4,946,798 | 8/1990 | Kawakatsu | 437/162 |
| 4,957,874 | 9/1990 | Soejima | 437/31 |
| 4,965,221 | 10/1990 | Dennison et al. | 437/67 |
| 4,975,381 | 12/1990 | Taka et al. | 437/31 |

OTHER PUBLICATIONS

Sze, S. M., VLSI Technology, p. 65, 1983.
Brassington et al., *IEEE Trans. Elect. Devices* (1989) pp. 712-719.
Momose et al., *IEDM Transactions* (Feb. 1985) p. 217.
Kapoor et al., "A High Speed High Density Single-Poly ECL Technology for Linear/Digital Applications", 1985 Custom Integrated Circuits Conference.
Gomi et al., *IEDM Technical Digest* (1988) pp. 744-747.

*Primary Examiner*—Brian E. Hearn
*Assistant Examiner*—C. Chaudhari
*Attorney, Agent, or Firm*—Townsend and Townsend

[57] ABSTRACT

A high performance bipolar transistor and a method of fabrication. Base resistance is reduced by a self-aligned silicide formed in the single-crystal region of the extrinsic base, thereby eliminating the polysilicon to single-crystal contact resistance as well as shunting the resistance of the single-crystal extrinsic base region. Oxide from the sidewall of the polysilicon local interconnection is selectively removed prior to silicide formation. Therefore, selected sidewalls of the poly interconnect layer also becomes silicided. This results in significant reductions in resistance of the interconnection, particularly for sub-micron geometries. Improved techniques for forming field oxide regions and for forming base regions of bipolar transistors are also disclosed.

13 Claims, 10 Drawing Sheets

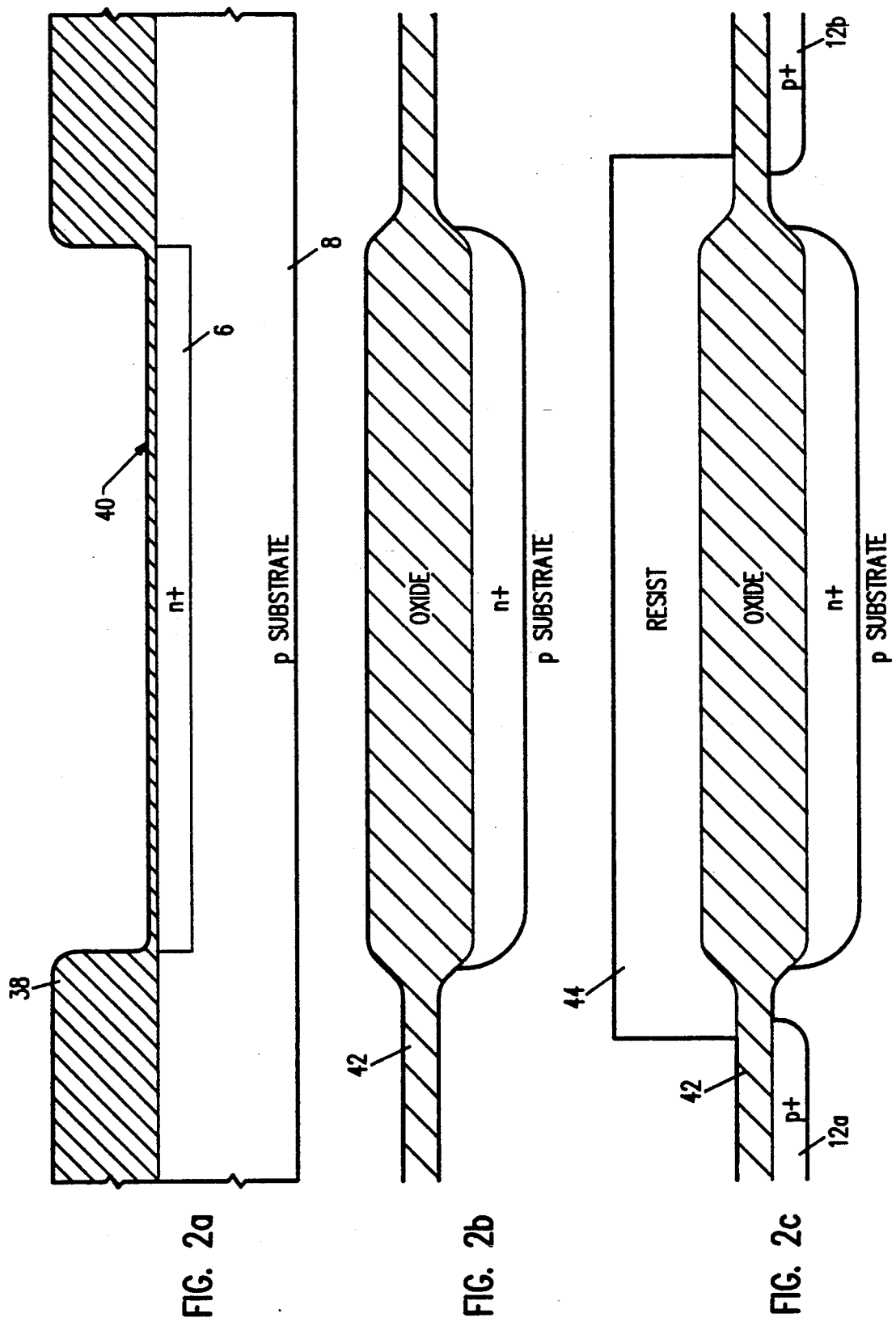

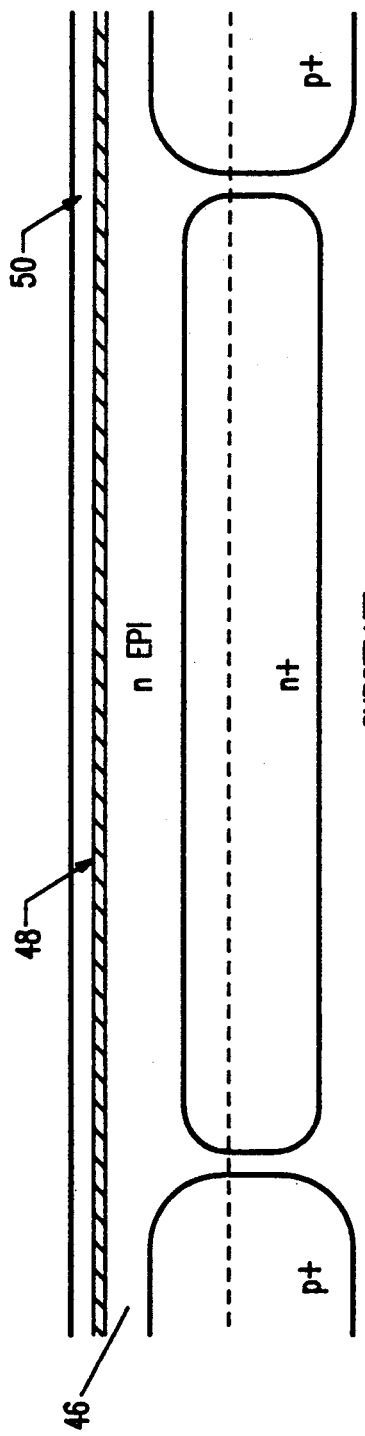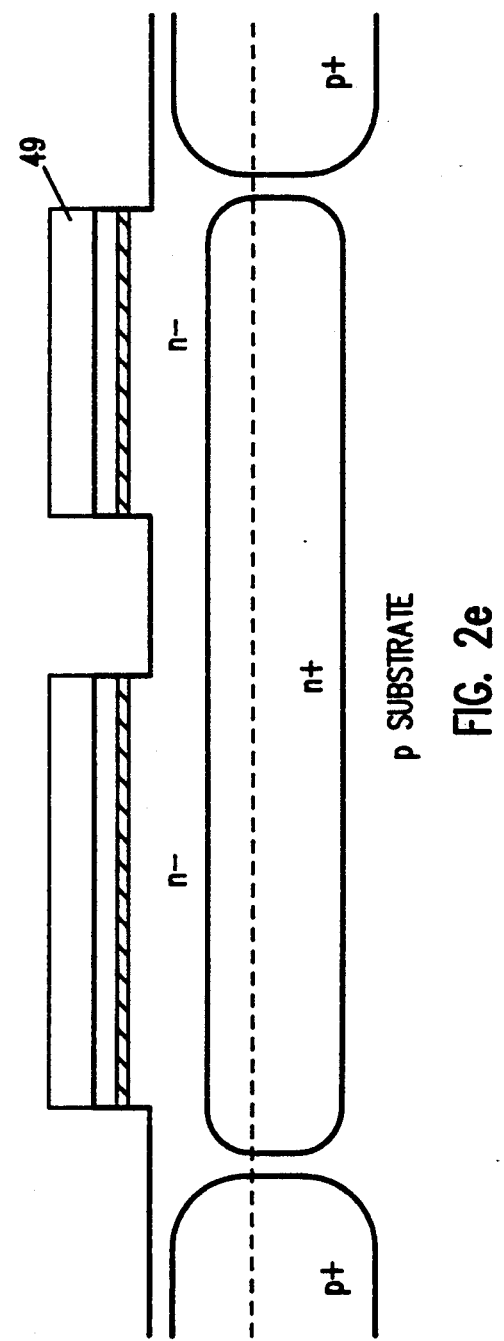

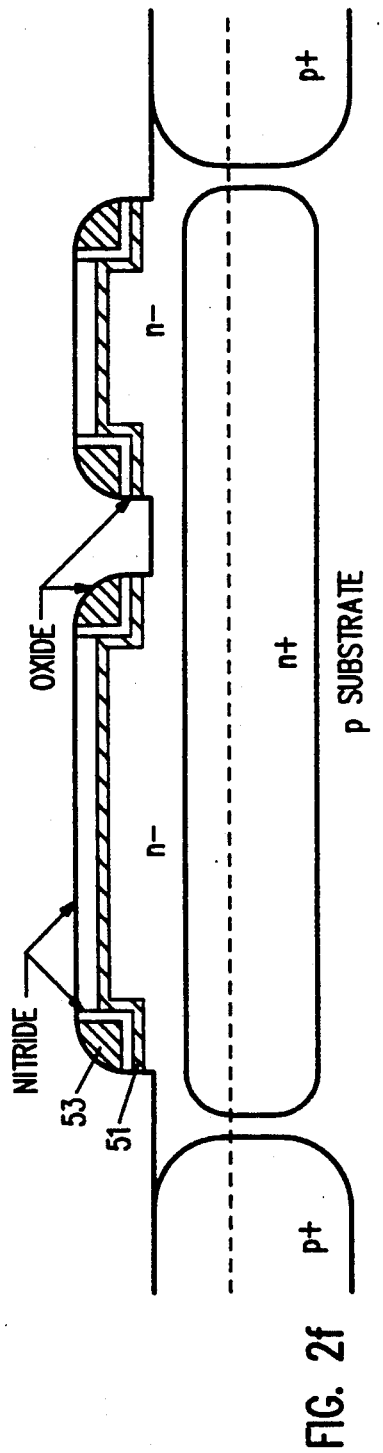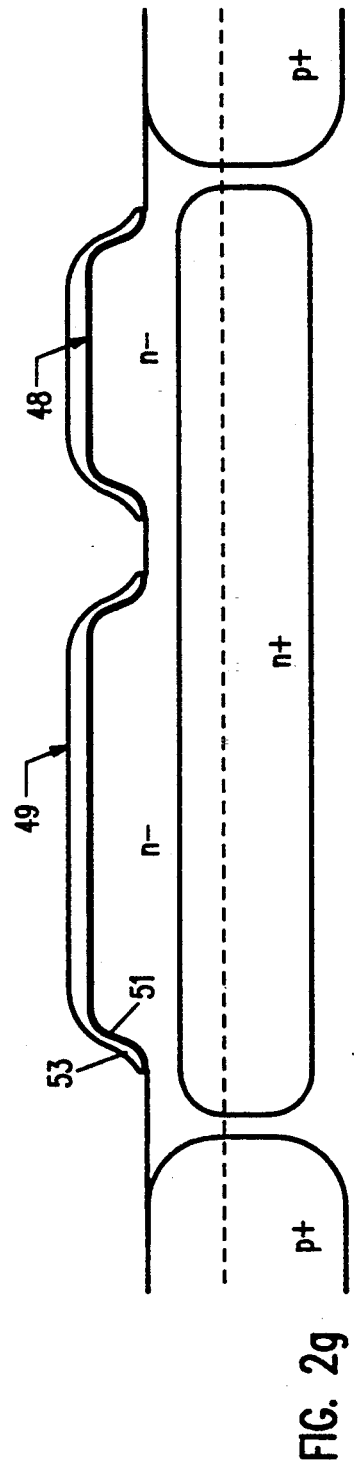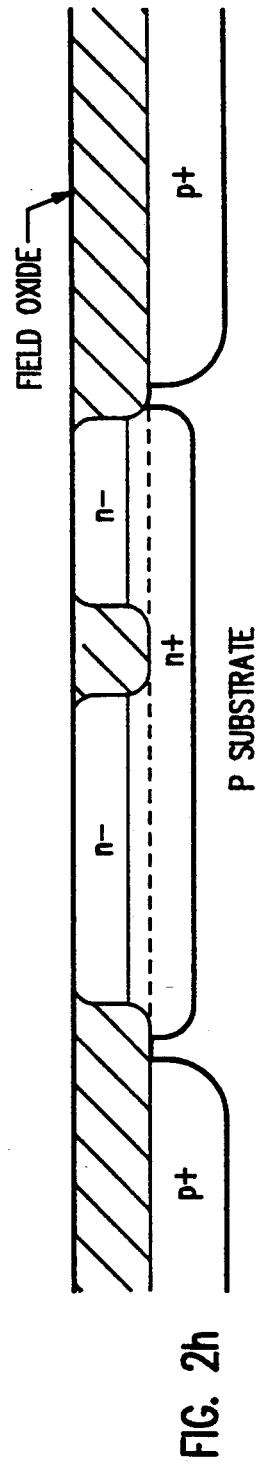
FIG. 2f
FIG. 2g
FIG. 2h

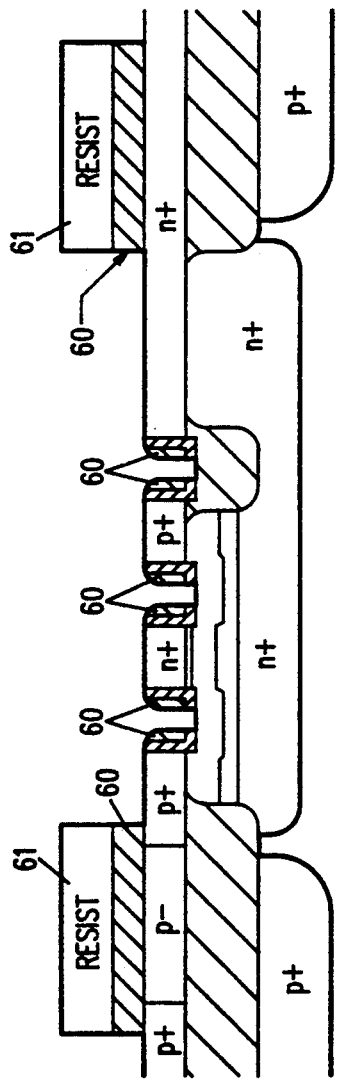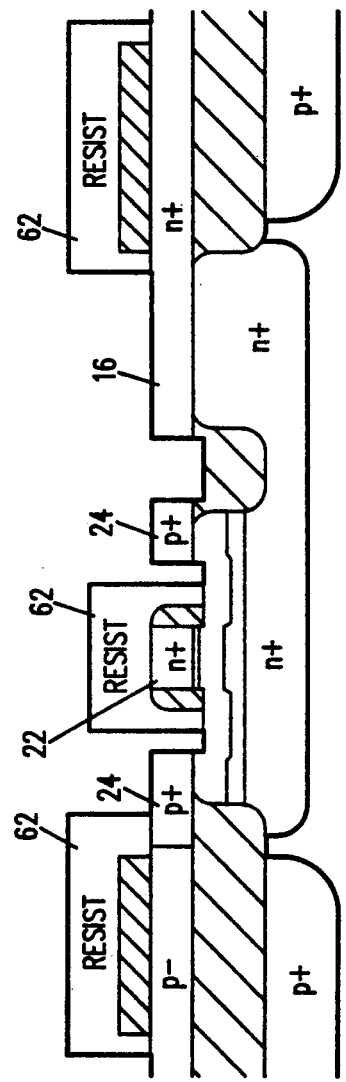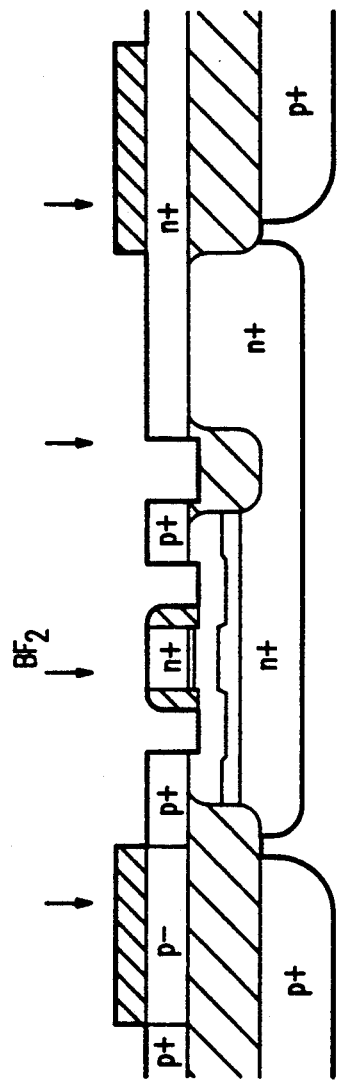

REDUCING BASE RESISTANCE OF A BJT BY FORMING A SELF ALIGNED SILICIDE IN THE SINGLE CRYSTAL REGION OF THE EXTRINSIC BASE

BACKGROUND OF THE INVENTION

The present invention relates to the field of semiconductor devices and their manufacture. More specifically, in one embodiment the present invention provides high performance semiconductor devices such as bipolar transistors as well as an improved method for their manufacture.

Bipolar semiconductor devices and their methods of manufacture are well known. Such devices are described in, for example, U.S. Pat. No. 4,609,568 (Koh et al.) and U.S. Pat. No. 4,764,480 (Vora), both assigned to the assignee of the present invention and incorporated herein by reference for all purposes.

Certain problems have arisen in the manufacture of semiconductor devices according to the prior art, however. For example, field oxide encroachment increases device area and, therefore, parasitic capacitance and resistance of devices. Further, previous single polysilicon bipolar devices have had high extrinsic base resistance and large collector-base capacitance. Still further, previous bipolar devices have silicide only on the upper portion of a polysilicon region used for a local interconnect. This results in particularly unacceptable resistance when polysilicon line widths are decreased. Still further, thermal cycles in existing processes create relatively deep junctions which limit the speed of devices. Still further, the packing density of previous bipolar devices has been limited by the area required for interconnect.

Accordingly it is seen that improved semiconductor devices as well as improved methods for their manufacture are desired.

SUMMARY OF THE INVENTION

Improved semiconductor devices and improved methods of forming semiconductor devices are disclosed. An improved isolation process provides reduced oxide encroachment which increases density, reduces capacitance, and increases reliability. Base resistance is reduced by a self-aligned silicide formed in the single-crystal region of the extrinsic base, thereby eliminating the polysilicon to single-crystal contact resistance as well as shunting the resistance of the single-crystal extrinsic base region. This also allows the polysilicon overlap onto the extrinsic base to be reduced, resulting in a reduction of extrinsic base area and, therefore, a reduction in base to collector capacitance. An improved method of forming a base region is also disclosed.

Accordingly, in one embodiment the invention provides a method of forming a base region for a bipolar transistor. The method includes the steps of providing a single-crystal region on a substrate, the single-crystal region comprising a first conductivity type; forming a doped polycrystalline region on the single-crystal region of a second conductivity type; and diffusing the dopant of a second conductivity type into the single-crystal region to form the base region in the single-crystal region.

A method of forming an isolation oxide region adjacent active regions in a semiconductor substrate is also disclosed. The method includes the steps of forming a first protective region on the first surface over the active regions and exposing first regions; etching the semiconductor substrate in the first regions to form recessed regions having sidewalls and substantially horizontal regions; forming a dielectric region on the semiconductor substrate; etching the dielectric region so as to substantially remove the dielectric region from the horizontal regions but not the sidewalls; and oxidizing the horizontal regions to form the isolation oxide regions in the substrate.

A method of fabricating a bipolar transistor having emitter, base, and collector regions is also disclosed. The method includes the steps of on a silicon substrate having a first surface, implanting dopants of a first conductivity type in a first region, the first region forming a portion of the collector; forming an epitaxial silicon layer on the first surface, the epitaxial layer doped to the first conductivity type; forming a first oxide layer on the epitaxial layer; forming a first nitride layer on the first oxide layer; masking the first nitride layer to define the base and collector sink regions; etching the epitaxial layer in regions not protected by the mask on the first nitride layer to form recesses in the epitaxial layer having substantially horizontal surfaces and sidewalls; removing the mask on the first nitride layer; forming a second oxide layer on the substrate; forming a second nitride layer on the second oxide layer; without a mask, etching the second oxide and nitride layers to remove oxide from the horizontal surfaces, but not the sidewalls and the base and collector region; oxidizing the horizontal surfaces to form field oxide regions; forming a polysilicon layer on the substrate; heavily doping the sink with dopants of the first conductivity type; implanting dopants of a second conductivity type into the polysilicon layer; diffusing the dopants of the second conductivity type into the base region; implanting dopants of the first conductivity type into at least a portion of the polysilicon region over the base region to form an emitter region of the first conductivity type; etching the polysilicon region to form the emitter, base contacts, and a sink contact; and implanting dopants of the second conductivity type so as to increase a dopant concentration in the base region between the emitter and the base contacts.

A further understanding of the nature and advantages of the inventions herein may be realized by reference to the remaining portions of the specification and the attached drawings.

DESCRIPTION OF THE PREFERRED EMBODIMENTS

CONTENTS

I. General Description
II. Description of Fabrication
III. Performance Characteristics

I. General Description

Figure 1A:
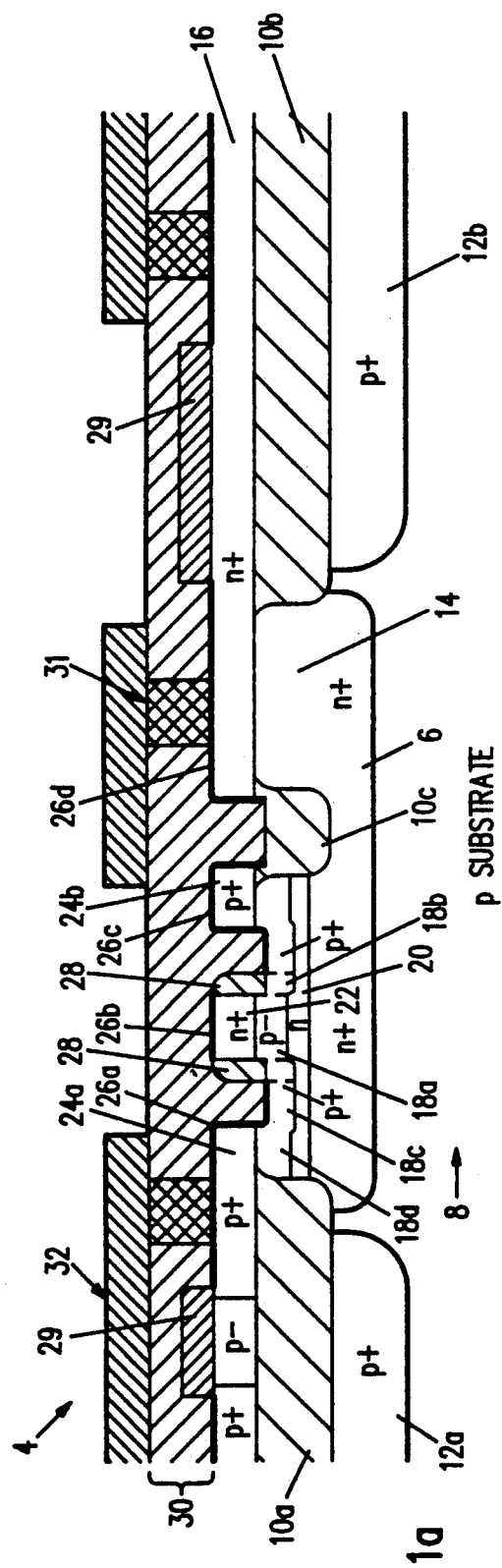
FIGS. 1a and 1b are cross-sections of a bipolar device according to two embodiments of the invention.

FIG. 1a is a cross-section of a bipolar transistor 2 and a resistor 4 according to a first embodiment of the invention. It should be recognized that while the invention is illustrated primarily with regard to a bipolar transistor, the invention is not so limited. The invention could readily be applied to field effect devices, metal-semiconductor devices, and the like. Further, while the invention is illustrated primarily with regard to an n-p-n device, it will be readily recognized by those of skill in the art that the role of n- and p-type conductivity regions could readily be reversed without departing from the scope of the invention herein. Still further, the invention could readily be applied to either lateral or vertical devices.

The bipolar transistor 4 includes an n+ buried layer 6 in a p− substrate 8. The buried layer 6 serves as a low resistivity path for mobile charge carriers in the collector region of the bipolar transistor structure. In preferred embodiments the peak dopant concentration of the buried layer 6 is between about $10^{17}$ and $10^{20}$/cm$^3$, although dopant concentrations between about $10^{18}$ and $10^{19}$/cm$^3$ are preferred. The resistivity of the substrate is preferably between about 30 and 50 ohm cm.

Adjacent the bipolar transistor, field oxide regions 10a and 10b are underlain by p+ channel stops 12a and 12b. The field oxide regions and channel stops serve to isolate the transistor from adjacent transistors and at the same time create a very high threshold voltage for the parasitic field effect structure formed by the substrate, the field oxide region and any overlying interconnect regions. In preferred embodiments, the peak dopant concentration in the channel stops is between about $10^{17}$ and $10^{18}$/cm$^3$. Oxide region 10c separates collector sink 14 from the active region of the transistor.

The collector region of the transistor is comprised of not only the buried layer, but also the collector sink region 14, which has a dopant concentration of the same order of magnitude as the buried layer. The sink extends to and is in contact with a heavily doped n+ collector contact 16 which acts as an interconnect to other devices on the structure.

Buried layer 6 contacts a base region 18 of the bipolar transistor via a more lightly doped n-type collector region 20 which preferably has a peak dopant concentration of between about $1 \times 10^{16}$ and $1 \times 10^{17}$/cm$^3$. The base region includes a shallow, lightly doped region 18a which is substantially self-aligned with an n+ emitter contact 22. The lightly doped region of the base is especially shallow and extends only about 1,800 to 2,200 Å from the emitter contact. Adjacent the lightly doped region of the base, moderately doped regions 18b (about $10^{18}$/cm$^3$) extend under the sidewall oxide regions 28. Adjacent the moderately doped regions, more heavily doped regions 18c extend from under the sidewall oxide and are self-aligned with p+ polycrystalline silicon (polysilicon) base contacts 24a and 24b. The more heavily doped regions 18c are preferably doped to a concentration of between about $5 \times 10^{18}$ and $5 \times 10^{19}$ with a preferred range of from $8 \times 10^{18}$ to $2 \times 10^{19}$. Regions 18b and 18c preferably extend between about 0.20 and 0.25 μm into the substrate from the bottom of the emitter. Regions 18d are diffused from the overlying p+ base contacts. Regions 18b, 18c, and 18d collectively form the extrinsic base region of the transistor.

Refractory metal silicide contacts 26a, 26b, 26c, and 26d, such as titanium silicide contacts, are used for the base contacts, the emitter contact, and the collector contact, respectively. The base contact silicide 26a/26c extends along the upper portion of the base contact poly 24a/24b, down its sidewall, and along the upper portion of the single-crystal base region 18 to sidewall oxide 28 on the emitter contact. The silicide contact 26b on the emitter contact extends along the upper surface of the emitter contact 22 from one sidewall to the opposite sidewall. The collector contact 16 is covered along its upper surface and sidewall with silicide region 26d. Silicide contacts as shown herein provide significantly reduced resistance to the polycrystalline and monocrystalline features such as the emitter, base, and collector contacts, as well as to the base region itself.

The resistor 4, base contact 24a, emitter contact 22, base contact 24b, and the collector contact 16 are all made from a single layer of polysilicon. The resistor 4 and other selected regions include silicide exclusion oxide 29 and the entire surface of the device is provided with cap oxide layer 30. Contact metal layer 32 extends along the cap oxide layer at selected locations for interconnection of the device. In preferred embodiments, tungsten plugs 31 fill the apertures in the cap oxide.

Figure 1B:
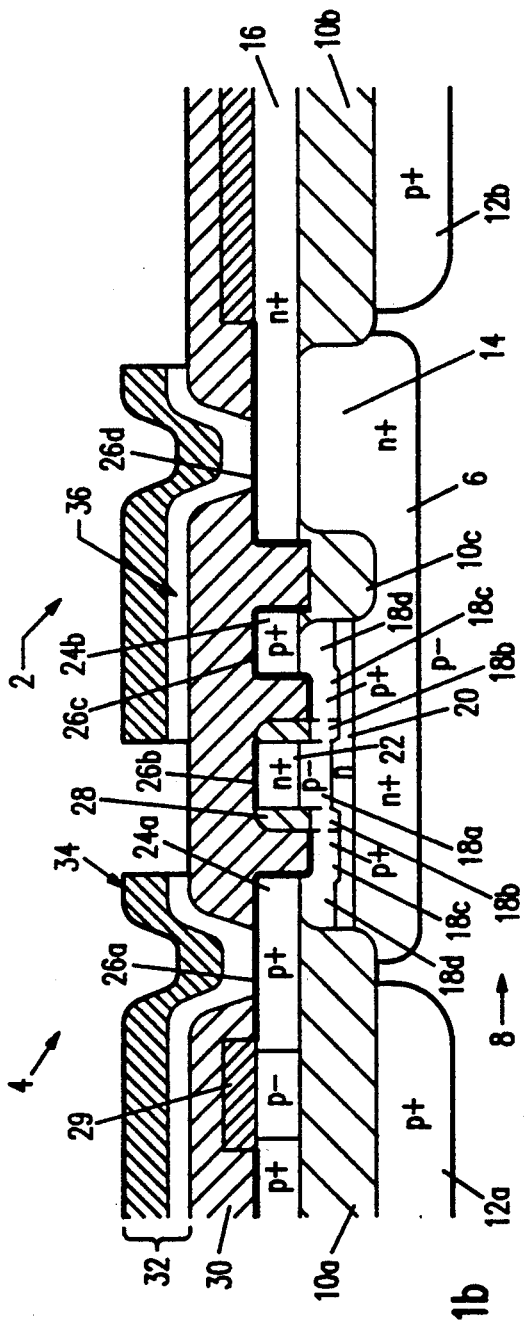

FIG. 1b illustrates an alternative embodiment of the interconnect. According to this embodiment, the contact metal includes a layer of AlSi 34 on a layer of TiW 36. The contact layer extends through the apertures in the oxide layer 30, with TiW 36 contacting selected silicide regions 26.

II. Description of Fabrication

Figure 2I:
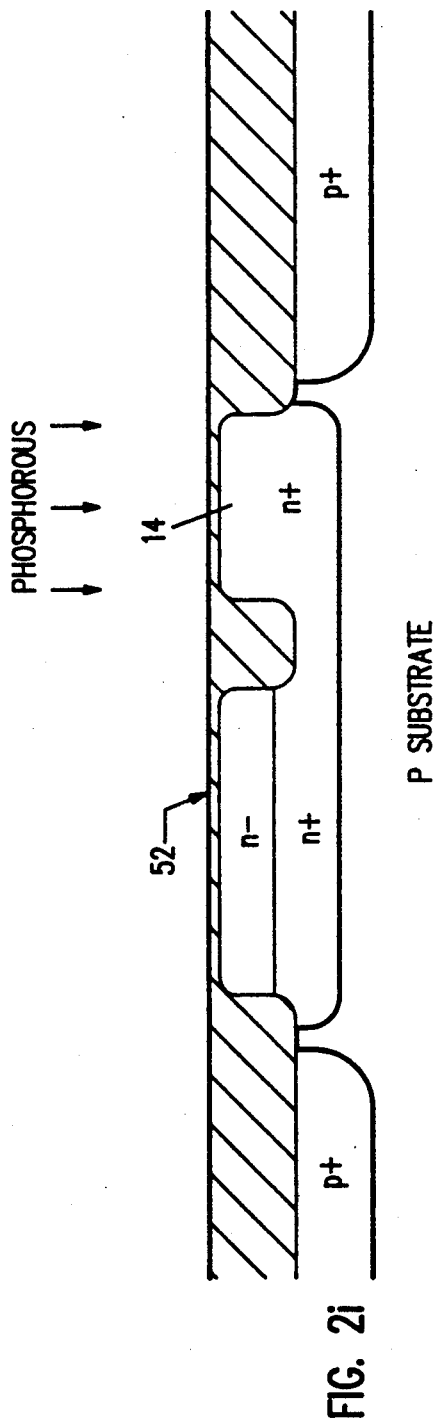
FIGS. 2a to 2t illustrate fabrication of the device shown in FIGS. 1a and 1b.
Figure 2J:
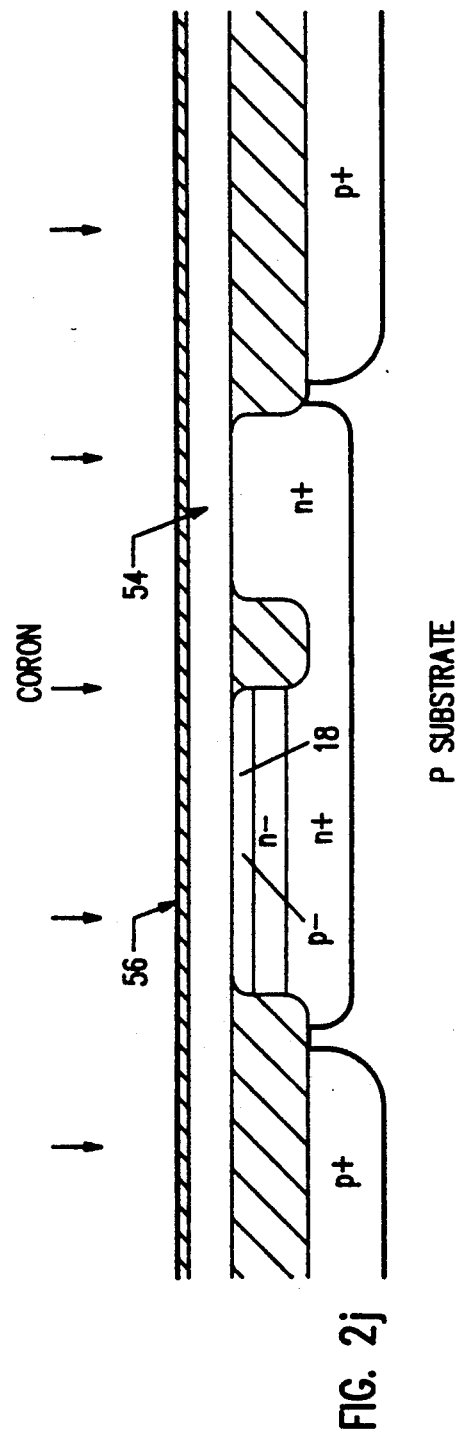
Figure 2K:
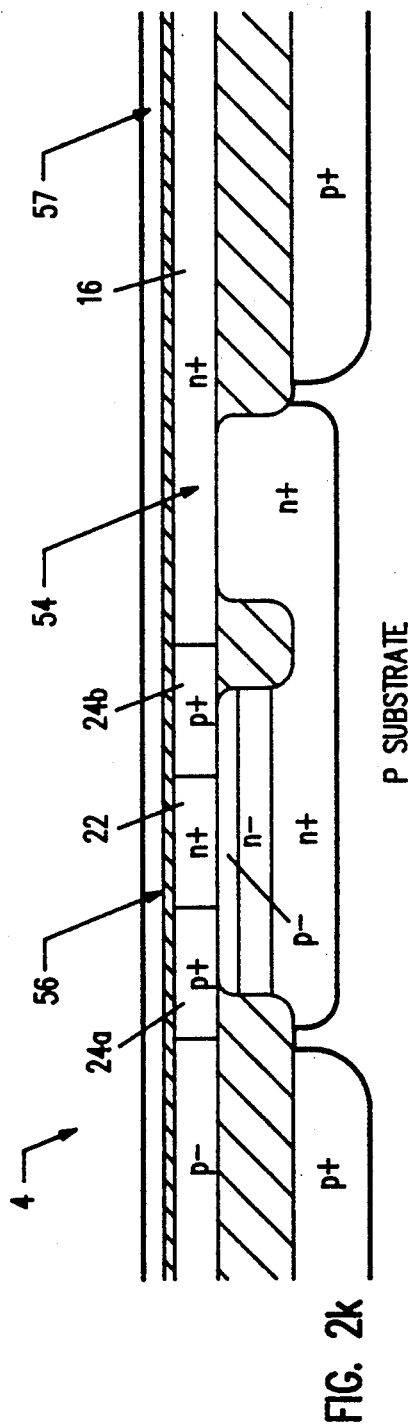
Figure 2L:
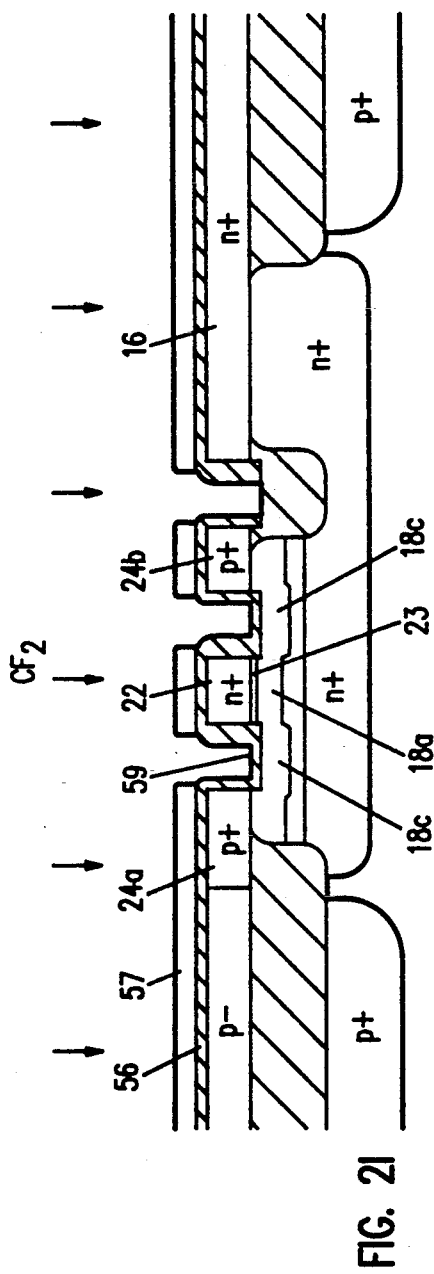
Figure 2P:
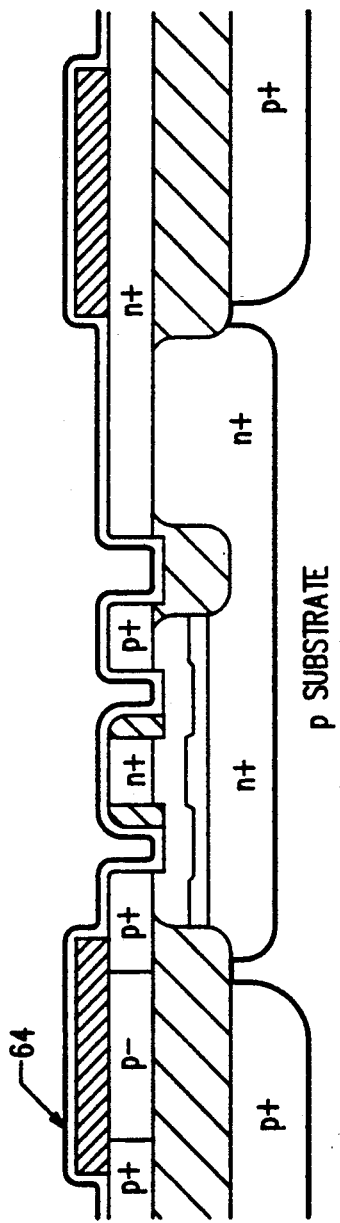
Figure 2Q:
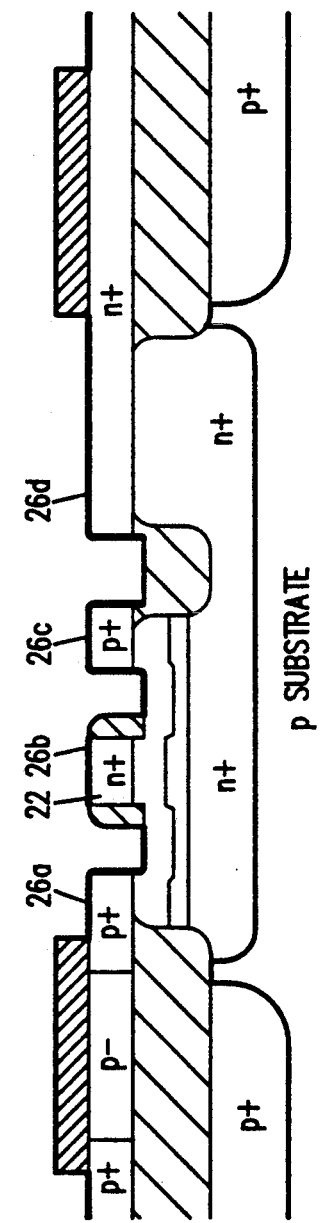
Figure 2R:
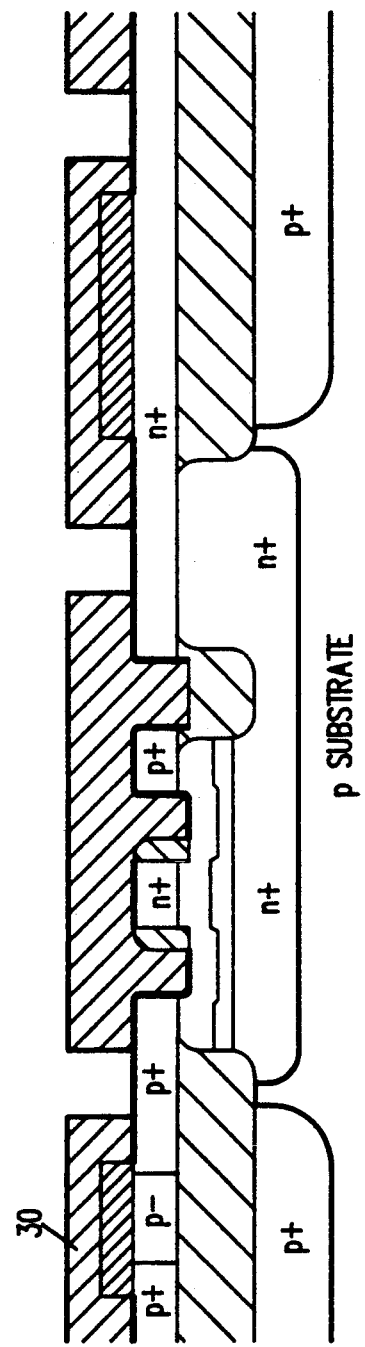
Figure 2S:
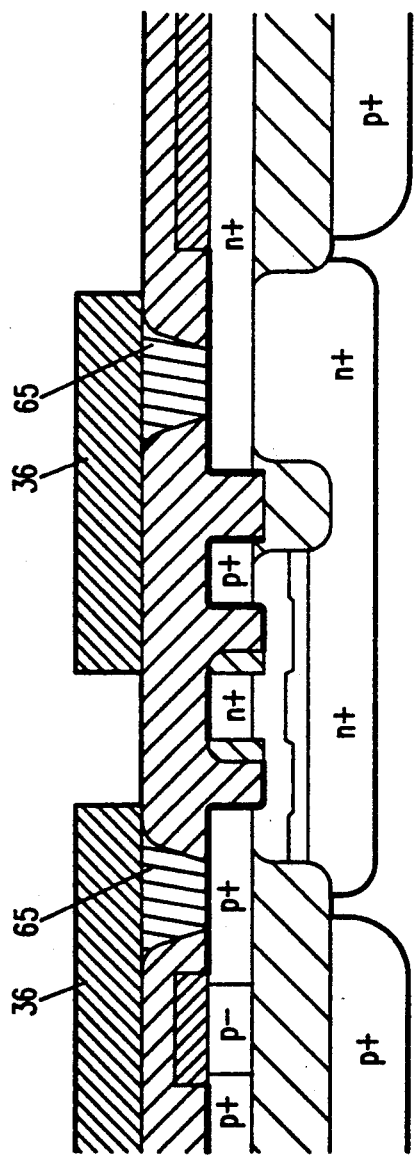
Figure 2T:
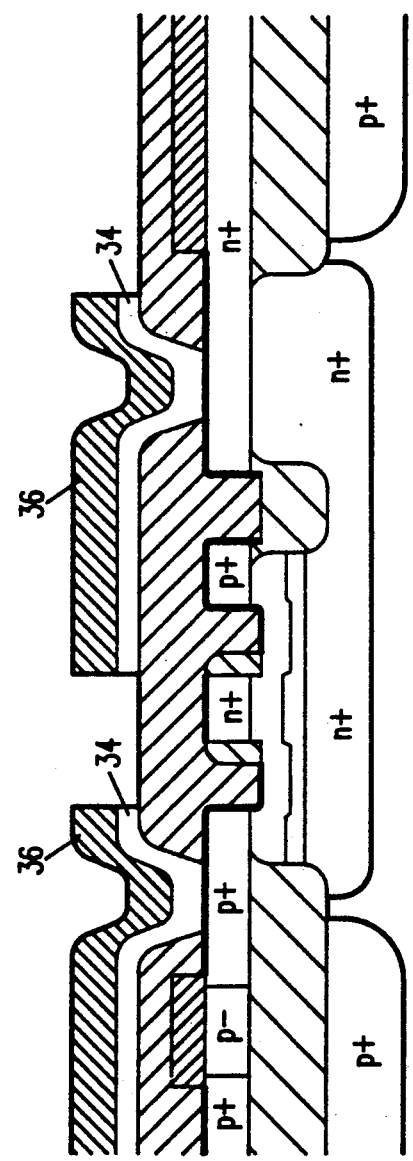

FIGS. 2a to 2t illustrate fabrication of a bipolar transistor according to one embodiment of the invention. As shown in FIG. 2a, a layer of initial thermal oxide is formed on a p-type substrate. In preferred embodiments the p− substrate has a resistivity of between about 30 and 50 ohm-cm. A denuded zone (depleted of oxygen contaminants and the like) 10 μm to 20 μm into the substrate and thin screen oxide region 40 are then formed simultaneously using conventional thermal processing. A mask 38 is then formed on the substrate to define the buried layer 6 of the transistor. It should be noted that by "mask" it is intended to mean a material formed on a substrate for protection of selected regions (as opposed to the lithographic element used to form the mask on the substrate).

An n+ implant using arsenic forms the buried layer of the bipolar transistor and the mask 38 is then removed. In preferred embodiments the buried layer is doped to a concentration of between about $10^{19}$ and $10^{20}$/cm$^3$ with a dopant concentration of about $5 \times 10^{19}$/cm$^3$ preferred. The buried layer implant uses an implant energy of between about 75 and 150 keV with an implant energy of between about 75 and 100 keV preferred.

Referring to FIG. 2b, the buried layer is thereafter annealed at a temperature of about 1100° C. for a time of about 80 minutes and another layer of oxide 42 is formed on the surface of the device. Due to differential oxidation rates of n+ and p− silicon, the oxide thickness grown over the buried layer is about two times the thickness over the remaining p− portions of the surface. This creates a step in the silicon which permits alignment of subsequent layers.

As shown in FIG. 2c, a mask 44 is then formed on the device so as to define the channel stops of the device and an implant is performed to provide p+ channel stops 12a and 12b, preferably using boron. In preferred embodiments the p+ channel stops have a dopant concentration of between about $10^{16}$ and $10^{19}$/cm$^3$ with a dopant concentration of about $10^{17}$/cm$^3$ preferred. The p+ implant used to form the channel stops uses an implant energy of between about 100 and 200 keV with an implant energy of between about 125 and 175 keV preferred.

In FIG. 2d the mask 44 and the oxide layer 42 on the substrate are removed. An n-type epitaxial silicon layer 46 having a dopant concentration of about $5 \times 10^{15}$ to about $5 \times 10^{16}/cm^3$ is grown on the device and an oxide layer 48 is formed thereon, also diffusing the n+ and p+ dopants into the epitaxial layer from the underlying substrate. In preferred embodiments, the n-epi layer has a dopant concentration of between about $1 \times 10^{16}$ and $3 \times 10^{16}/cm^3$. A layer of nitride 50 is deposited on the oxide layer 48, preferably having a thickness of about 1500 Å. In preferred embodiments the epitaxial silicon layer has a thickness of between about 0.8 and 1.5 $\mu$m with a thickness of between about 1.0 and 1.2 $\mu$m preferred.

Referring to FIG. 2e, an active area mask 49 is formed on the surface of the device which protects regions of the device that will ultimately form the base and collector sink of the transistor. An etch of the exposed nitride, oxide, and silicon is then performed to provide the structure shown in FIG. 2e. The silicon is preferably etched about 0.3 $\mu$m below its original surface. After removal of the mask, a grown oxide/nitride/deposited oxide sandwich is then formed on the device. Referring to FIG. 2f, the thermally grown oxide 51 is preferably about 400 Å thick, while the deposited nitride 53 is preferably about 600 Å thick, and the deposited oxide 55 is originally 1800 Å thick. An unmasked etch of this oxide/nitride/oxide sandwich leaves the oxide/nitride/oxide sandwich on the sidewall of the exposed silicon etch and the first nitride/oxide over the previously masked regions. The silicon is preferably etched about 750 Å below its previous level with a plasma etch. FIG. 2f shows the resulting structure. The remaining oxide spacer 53 is then removed using BOE, providing the structure shown in FIG. 2g.

Referring to FIG. 2h, a field oxidation is then performed by high pressure (e.g., 10 atmospheres) steam oxidation. The top of the field oxide is grown to be substantially planar with the top of the base/collector sink. The field oxidation preferably uses a temperature of about 1000° C. such that about 1 micron of oxide is formed or until the field oxide is level with the surface of the substrate. Remaining exposed nitride is then stripped from the device.

Referring to FIG. 2i, a screen oxide 52 is then formed on the base and collector regions of the bipolar transistor. The device is masked with photoresist to expose only the sink region 14 of the device and an n+ implant is performed with phosphorus so as to dope the sink region to a concentration of between about $1 \times 10^{19}$ and $1 \times 10^{21}/cm^3$ using an implant energy of between about 100 to 200 keV. The sink mask is then removed.

In an alternative embodiment, an additional mask is formed so as to expose only selected emitter regions. An additional n+ implant is performed to raise the epitaxial layer doping under the emitter contact to between about $10^{16}$ to $10^{17}/cm^3$. This increases the performance of the transistors when operated at high current densities. Further, this implant permits formation of transistors optimized for low current and high current operation on the same wafer.

In FIG. 2j, an intrinsic polysilicon layer 54 is formed on the surface of the device. An unmasked p implant is performed using boron across the entire surface of the device. The p-type material is annealed in an oxygen environment so as to form oxide 56 and p-type material is diffused from the polysilicon into the single-crystal base region such that the average dopant concentration in the base region 18 is between about $1 \times 10^{17}$ and $2 \times 10^{18}/cm^3$ with an average dopant concentration of about $1 \times 10^{18}/cm^3$ preferred. The base implant uses an implant energy of between about 20 and 60 keV with an energy of between about 30 and 50 keV preferred. In preferred embodiments, this diffusion step results in a base thickness below the bipolar emitter of between about 0.15 and 0.25 $\mu$m with a thickness of about 0.20 $\mu$m preferred. This implant is also used to form lightly doped regions of polysilicon to act as, for example, resistors.

As shown in FIG. 2k, a mask is then formed on the device so as to define base contact regions 24a and 24b, and contact portions of the resistor 4. A p+ implant is performed using boron to dope these regions to a concentration of about $1 \times 10^{20}/cm^3$. The p+ mask is removed and an n+ mask and implant is used to form the emitter contact region 22 and the collector contact region 16. The n+ mask is then removed and a nitride layer 57 is deposited. The n+ and p+ implants preferably use an implant energy of between about 40 and 100 keV.

The device is then masked so as to protect the p+ resistor/base contact 24a, the base contact 24b, the emitter contact 22, and the collector contact 16. The exposed poly is etched to provide the poly structure shown in FIG. 2l. The resist is then removed and the exposed silicon areas are oxidized to provide an oxide layer 59 having a thickness of about 150 Å. This thermal cycle also serves to diffuse the n+/p+ dopants from the poly emitter/base contacts and form emitter region 23. The poly overetch is controlled to be slightly greater than the emitter diffusion depth in order to reduce emitter-base capacitance. In preferred embodiments, the emitter 23 extends about 1000 Å into the epi layer while the silicon is over etched about 1200 Å from the surface of the epi layer. A p-type implant is then performed using $BF_2$ to form a moderately doped link base region which is self-aligned to the emitter contact and extends from the emitter contact to the base contact. The nitride over the polysilicon serves to mask this implant. The doping level of the exposed base region is adjusted to minimize base resistance and improve the emitter-base breakdown characteristics. In preferred embodiments, the region between the emitter and base contacts is doped to an average dopant concentration of between about $1 \times 10^{17}$ and $1 \times 10^{19}/cm^3$ with a dopant concentration of about $5 \times 10^{18}/cm^3$ preferred. This base implant uses an implant energy of between about 30 and 50 keV with an implant energy of about 40 keV preferred. The base region 18a below the emitter remains very shallow (on the order of about 0.15 to 0.25 $\mu$m in preferred embodiments) while the link base 18c is thicker (on the order of 0.25 to 0.30 $\mu$m in preferred embodiments).

Referring to FIG. 2m, an extrinsic base cap oxidation is performed to anneal implant damage. The nitride over the polysilicon is then removed by a selective etch. A layer of oxide 60 having a thickness of about 0.4 $\mu$m is deposited on the surface of the device and a mask 61 is formed to protect areas of the oxide where it is desired not to ultimately produce a silicide interconnect (e.g., over the center portion of the resistor) and a spacer etch is performed using means well known to those of skill in the art to leave oxide sidewalls on the base contacts, the emitter, and the collector contact. The mask 61 is then removed. The oxide is also masked so as to leave oxide on regions of the wafer (not shown) which are not covered by polysilicon (except for the active transistor areas). This increases the ultimate oxide thickness between metal layers and the substrate reducing device capacitance, as well as producing an approximately planar surface for the formation of subsequent levels of oxide/interconnect.

In FIG. 2n, a resist mask 62 is formed on the device which protects the oxide silicide exclusion regions on the resistors and the like, as well as the oxide on the sidewall of the emitter regions of the bipolar transistors. A spacer removal etch is then performed so as to remove oxide from the sidewalls of the base contacts 24 and the collector contact 16, leaving oxide sidewalls on the emitter contact 22, but not on the sidewalls of the base contacts and collector contact.

It should be recognized that the inventions herein have been illustrated primarily with regard to the use of a mask to selectively remove oxide from the sidewalls of the poly contact layers, but selective growth and etching of p+ and n+ contacts may also be used, as disclosed in Application Ser. No. 07/503,491 which is incorporated herein by reference for all purposes.

The mask shown in FIG. 2n is then removed and an additional blanket p+ implant is performed as shown in FIG. 2o. The implant is masked from the resistors by the silicide exclusion oxide and serves to increase the concentration of the resistor ends and in the extrinsic base region, thereby reducing the ultimate silicide to silicon/polysilicon contact resistance. The implant uses $BF_2$ at about 40 keV and results in an exposed surface dopant concentration of about $1 \times 10^{19}$ to $1 \times 10^{20}/cm^3$ and a junction depth of about 0.25 to 0.30 $\mu$m. A final anneal is then performed for about 20 seconds at about 1,050° C. The use of a rapid thermal anneal improves dopant activation and minimizes encroachment of the extrinsic base under the emitter.

In FIG. 2p, a silicide preclean step is performed to remove oxide from regions which are to be silicided. A layer of refractory metal 64 such as titanium is thereafter deposited on the surface of the device. As shown in FIG. 2q, a first silicide reaction step is then carried out in which TiSi is formed over exposed silicon/polysilicon. Excess titanium is then stripped from the device and a second silicide reaction step at a higher temperature (e.g., 800° C.) is carried out in which the silicide sheet resistance is reduced. This leaves silicide straps 26a and 26c on the upper portion and sidewall of the base contacts 24 which further extend along the surface of the extrinsic single-crystal base region up to the sidewall oxide of the emitter. Silicide 26b is left on the upper surface of the emitter contact 22 extending from one sidewall to the opposite sidewall. Similarly, silicide strap 26d is formed on the sidewall and the upper surface of the collector contact.

FIG. 2r illustrates the formation of a contact oxide layer 30. The oxide layer is formed by deposition of a CVD oxide, and SOG (Spin On Glass) spincoat using techniques well known as in, for example, U.S. Pat. No. 4,806,504, which is incorporated herein by reference. Thereafter, a planarization etchback is performed to planarize the surface of the device. A chemical vapor deposition cap oxide is then formed and a contact mask is formed so as to define contact regions of the device.

FIG. 2s illustrates the contact scheme shown in FIG. 1a, along with its method of formation. In FIG. 2s, tungsten is deposited and etched back by plasma etching to form tungsten plugs 65. This permits contacts/vias with aspect ratios (height-to-width) of greater than about 2 and hence reduces the required contact size and permits the use of thicker intermetal oxide for reduced capacitance. The overall planarity of the surface is improved, and metal step coverage issues are eliminated. Thereafter, a layer of AlSi (aluminum silicon) 36 is deposited and etched to form the first layer contact metal.

FIG. 2t illustrates formation of the contact scheme shown in FIG. 1b. According to this embodiment, a layer of TiW 34 is formed on the device, followed by a layer of AlSi (aluminum silicon) 36. This two-layer metal interconnect provides a low sheet resistance interconnect. A metal mask is formed on the device to remove shorts between regions of the metal contacts and a metal etch is performed. Multiple metal interconnection layers (e.g., five levels of metallization) are, thereafter, formed by sequential deposition of oxide, formation of contact holes, deposition of metal, and metal etching.

III. Performance Characteristics

Devices exemplary of the above-described inventions were fabricated. The devices had field oxide regions with reduced bird's head and a minimum active area dimension of 1.6 $\mu$m for a 1.0 $\mu$m-thick field oxide. The co-diffused emitter-base profile provided a narrow (700 Å) neutral base width with excellent uniformity across a 6-inch wafer with negligible $I_{ceo}$ leakage. The extrinsic base region had a lateral profile which was self-aligned to the emitter poly, minimizing the extrinsic base encroachment under the emitter. Spacer oxide from the base poly was selectively removed in order to provide direct connection to the extrinsic base region by the silicide. This allows for reduction of the extrinsic base area as well as lower base resistance. The product of $R_b * C_{jc}$ was reduced approximately 25% resulting in a 13% reduction in gate delay. High tolerance on poly resistors was maintained with reduced resistor size by minimizing encroachment and end-effect variation. Three poly resistors combined with diffused resistors of similar values provided simplified circuit design and layout. The metal capacitance of 4 fF/mil translates to 1.0 pS/mil at 600 $\mu$A switching current and 2.5 pS/mil at 200 $\mu$A for metal 1, metal 2, and metal 3. The process, with three values of poly resistors, requires 17 masks to metal 4.

Figure 3:
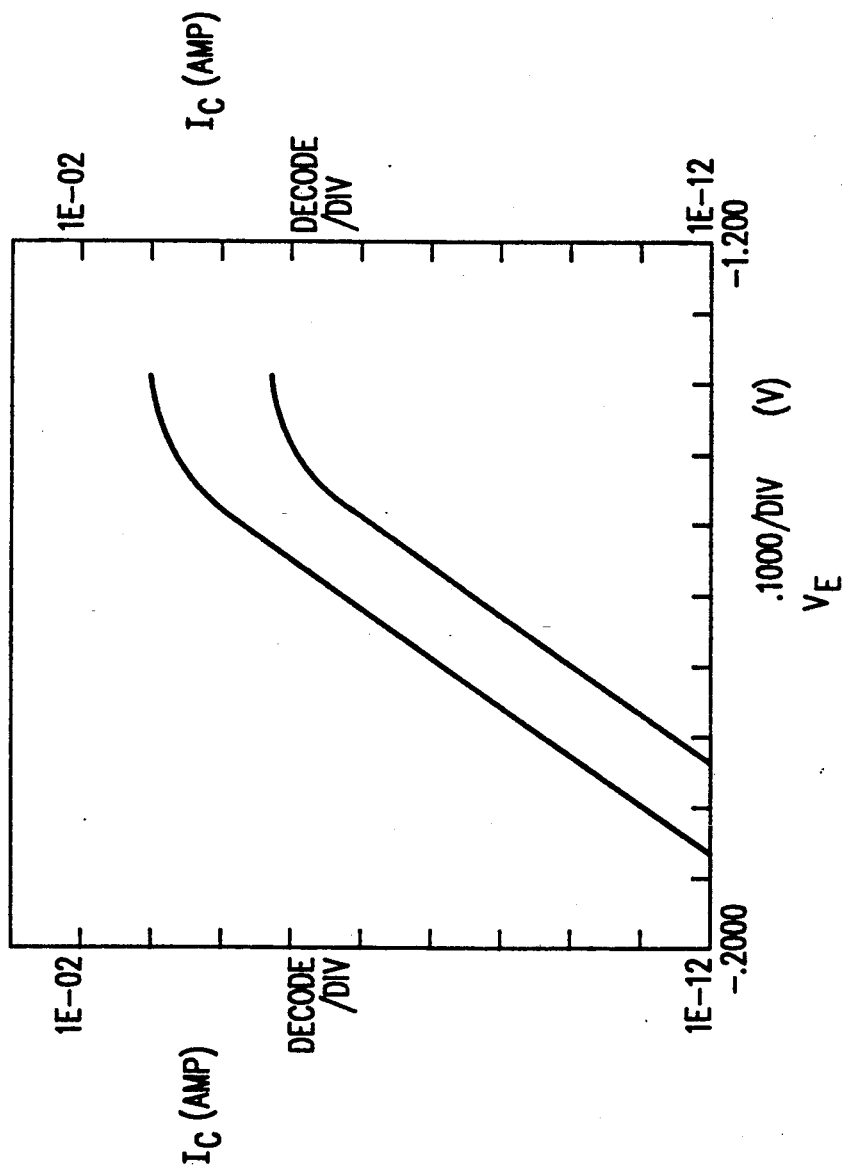
FIG. 3 is a gummel plot for devices fabricated according to one aspect of the invention.

Table 1 illustrates the overall characteristics of the fabricated devices. FIG. 3 shows Gummel plots for devices with a 0.8×2.5 $\mu$m² emitter. Near ideal device characteristics and a beta of approximately 100 are obtained.

TABLE 1

| NPN Transistor Parameters | |
|---|---|
| Emitter Area | 0.8 $\mu$m × 1.6 $\mu$m |
| Device Area | 1.6 $\mu$m × 6.1 $\mu$m |
| Base Contacts | 1 |
| Current Gain | 90 |
| E-B Breakdown | 6 V |
| C-B Breakdown | 16 V |
| C-E Breakdown | 8 V |
| E-B Capacitance | 8.7 fF |
| C-B Capacitance | 2.9 fF |
| C-S Capacitance | 10.5 fF |
| Emitter Resistance | 86 ohms |
| ECL Ring Oscillator | <50 pS @ 1 mA/gate |
| Speed Power Product | <50 fJ |

| TABLE 1-continued | |
| --- | --- |
| NPN Transistor Parameters | |
| at Low Currents | |
| Gate Delay | 8.3 nS @ 2 watts |

A 16-bit multiplier which was originally designed using the "ASPECT-I" process (2 μm feature size) and which has approximately 6000 equivalent gates, was used as a point of comparison to demonstrate the scalability of design using the inventions herein. The layout was shrunk by software manipulation without the need for additional custom layout. The final layout area is 40% of the original. A multiply delay of 8.3 nS at 2 watts was obtained using the inventions herein. This was an improvement of 25% in speed and 50% in power as compared to the original layout, consistent with the scaling of the power/delay product.

It is to be understood that the above description is intended to be illustrative and not restrictive. Many variations of the invention will become apparent to those of skill in the art upon review of this disclosure. Merely by way of example the method and devices described herein could be incorporated into MOS devices or structures having both bipolar and MOS devices. For example, the inventions herein could be incorporated into a BiCMOS process as disclosed in U.S. patent application Ser. No. 07/502,943 assigned to the assignee of the present invention and incorporated herein by reference for all purposes. The scope of the invention should, therefore, be determined not with reference to the above description, but instead should be determined with reference to the appended claims along with their full scope of equivalents.

What is claimed is:

1. A method of forming a base region for a bipolar transistor comprising the steps of:
   (a) providing a single-crystal region on a substrate, said single-crystal region comprising a first conductivity type;
   b) forming a polycrystalline region on said single-crystal region, at least portions of said polycrystalline region doped with a dopant of a second conductivity type;
   c) diffusing said dopant of a second conductivity type into said single-crystal region to form said base region in said single-crystal region;
   d) implanting an emitter contact region of said polycrystalline region with dopants of said first conductivity type; and
   e) etching said polycrystalline region to form said emitter contact.

2. The method as recited in claim 1 wherein said single-crystal region is an epitaxial silicon region and said polycrystalline region is a polysilicon region.

3. The method as recited in claim 1 further comprising the step of doping a second portion of said polycrystalline region with a dopant of said first conductivity type, said portion forming an emitter of said bipolar transistor.

4. The method as recited in claim 3 wherein the step of doping said polycrystalline region is a step of doping substantially all of said polycrystalline with said dopant of said second conductivity type and wherein said step of forming an emitter region compensates said polycrystalline silicon to said first conductivity type.

5. The method as recited in claim 3 further comprising the step of doping a second region of said polycrystalline regions to a second conductivity type, said second region forming a base contact of said bipolar transistor.

6. The method as recited in claim 3 further comprising the step of doping third regions of said polycrystalline region with a dopant of said first conductivity type, said third regions comprising collector contacts of said bipolar transistor.

7. The method as recited in claim 1 wherein said step of doping said polycrystalline region simultaneously forms lightly doped regions of resistors.

8. The method as recited in claim 1 wherein said steps of doping said polycrystalline region with a dopant of a second conductivity type provides a net dopant concentration in said single-crystal region of less than about $1 \times 10^{18}/cm^3$.

9. The method as recited in claim 1 wherein a junction depth of said bipolar transistor is less than about 0.25 μm.

10. The method as recited in claim 1 further comprising the step of implanting a dopant of said second conductivity type, said step of implanting forming a low resistance region in said base, said low resistance region aligned with said emitter.

11. The method as recited in claim 1 further comprising the steps of masking and etching said polycrystalline region to define said emitter, said etching step etching through said polycrystalline and into said single-crystal region to a depth greater than a junction depth of said emitter.

12. A method of fabricating a bipolar transistor having emitter, base, and collector regions comprising the steps of:
   a) on a silicon substrate having a first surface, implanting dopants of a first conductivity type in a first region, said first region forming a portion of said collector;
   b) forming an epitaxial silicon layer on said first surface, said epitaxial layer doped to said first conductivity type;
   c) forming a first oxide layer on said epitaxial layer;
   d) forming a first nitride layer on said first oxide layer;
   e) masking said first nitride layer to define said base and collector sink regions;
   f) etching said epitaxial layer in regions not protected by said mask on said first nitride layer to form recesses in said epitaxial layer having substantially horizontal surfaces and sidewalls;
   g) removing said mask on said first nitride layer;
   h) forming a second oxide layer on said substrate;
   i) forming a second nitride layer on said second oxide layer and a third nitride layer on said second nitride layer;
   j) without a mask, etching said oxide and nitride layers to remove oxide and second nitride from said horizontal surfaces, but not said sidewalls and said base and collector region;
   k) oxidizing said horizontal surfaces to form field oxide regions;
   l) heavily doping said sink with dopants of said first conductivity type;
   m) forming a polysilicon layer on said substrate;
   n) implanting dopants of a second conductivity type into said polysilicon layer;
   o) diffusing said dopants of said second conductivity type into said base region;

p) implanting dopants of said first conductivity type into at least a portion of said polysilicon region over said base region to form an emitter contact region of said first conductivity type;
q) etching said polysilicon region to form said emitter contact, base contacts, and a sink contact;
r) implanting dopants of said second conductivity type so as to increase a dopant concentration in said base region between said emitter and said base contacts;
s) forming oxide on sidewalls of said emitter contact;
t) forming metal silicide on exposed regions of silicon along an upper surface of said device, said metal silicide extending along an upper surface of said base region up to said oxide sidewalls;
u) forming an oxide layer having contact apertures on said device;
v) filling said apertures with tungsten; and
w) forming an aluminum silicon contact layer on said oxide layer.

13. A method of forming a base region for a bipolar transistor comprising the steps of:
a) providing a single-crystal region bounded by field oxide regions on a substrate, said single-crystal region having a first conductivity type, wherein said single crystal region and said field oxide regions define an active region;
b) forming a polycrystalline region on said active region, said polycrystalline region covering substantially all of said active region, at least portions of said polycrystalline region being doped with a dopant of a second conductivity type; and
c) diffusing said dopant of a second conductivity type into said active region to form said base region in said single-crystal region, wherein said diffusion occurs across substantially all of said active region.

* * * * *